US009899358B2

(12) United States Patent
Tate et al.

(10) Patent No.: US 9,899,358 B2
(45) Date of Patent: Feb. 20, 2018

(54) MODULE STACKING MECHANISM WITH INTEGRATED GROUND

(71) Applicant: Intel Corporation, Santa Clara, CA (US)

(72) Inventors: Alan W. Tate, Puyallup, WA (US); Andrew F. Thompson, Lakewood, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/163,197

(22) Filed: May 24, 2016

(65) Prior Publication Data

US 2017/0345803 A1 Nov. 30, 2017

(51) Int. Cl.
*H05K 7/00* (2006.01)
*H01L 25/10* (2006.01)
*H05K 1/18* (2006.01)
*H01L 25/00* (2006.01)
*H05K 3/30* (2006.01)

(52) U.S. Cl.
CPC ............ *H01L 25/105* (2013.01); *H01L 25/50* (2013.01); *H05K 1/18* (2013.01); *H05K 3/30* (2013.01); *H01L 2225/1023* (2013.01); *H01L 2225/1064* (2013.01); *H01L 2225/1082* (2013.01); *H05K 2201/10159* (2013.01); *H05K 2201/10189* (2013.01); *H05K 2201/10393* (2013.01); *H05K 2201/10409* (2013.01); *H05K 2201/10515* (2013.01)

(58) Field of Classification Search
CPC .................. H01L 25/50; H01L 25/105; H01L 2225/1023; H01L 2225/1064; H01L 2225/1082; H05K 1/18; H05K 3/30; H01K 2201/10515; H01K 2201/10409; H01K 2201/10159; H01K 2201/10189
USPC ........................................ 361/735, 729, 790
See application file for complete search history.

(56) References Cited

U.S. PATENT DOCUMENTS

| | | | | |
|---|---|---|---|---|
| 6,038,140 | A * | 3/2000 | Petri ....................... | H05K 7/142 174/138 G |
| 7,391,619 | B1 * | 6/2008 | Lee ....................... | H05K 7/1417 361/726 |
| 7,746,654 | B2 * | 6/2010 | Franz ....................... | G06F 1/185 361/679.02 |
| 8,446,729 | B2 * | 5/2013 | Schuette ............... | G06F 3/0626 235/441 |
| 9,342,116 | B2 * | 5/2016 | Lai ........................ | G06F 1/185 |
| 9,564,712 | B1 * | 2/2017 | Shih .......................... | G06F 1/18 |

(Continued)

*Primary Examiner* — Hung S Bui
(74) *Attorney, Agent, or Firm* — Schwabe, Williamson & Wyatt, P.C.

(57) ABSTRACT

Printed circuit board (PCB) structures and methods of assembling them are described herein. In some embodiments, a PCB structure may include a first mounting hole; first, second, and third projections radiating from the first mounting hole; and a second mounting hole adjacent to the third projection. The first and second mounting holes located at opposite ends of the third projection. The second mounting hole to cause an electrical coupling of a bottom integrated circuit (IC) module to a connection structure included in a PCB, and the first mounting hole, the first projection, and the second projection to cause positioning of a top IC module above the bottom IC module and electrical coupling of the top IC module to the connection structure.

27 Claims, 11 Drawing Sheets

(56) References Cited

U.S. PATENT DOCUMENTS

| | | | |
|---|---|---|---|
| 2008/0298040 A1* | 12/2008 | Lee .................... | H05K 7/1405 |
| | | | 361/809 |
| 2016/0259754 A1* | 9/2016 | Ping .................... | G06F 3/0688 |
| 2017/0164501 A1* | 6/2017 | Killen ................ | H05K 7/1492 |

* cited by examiner

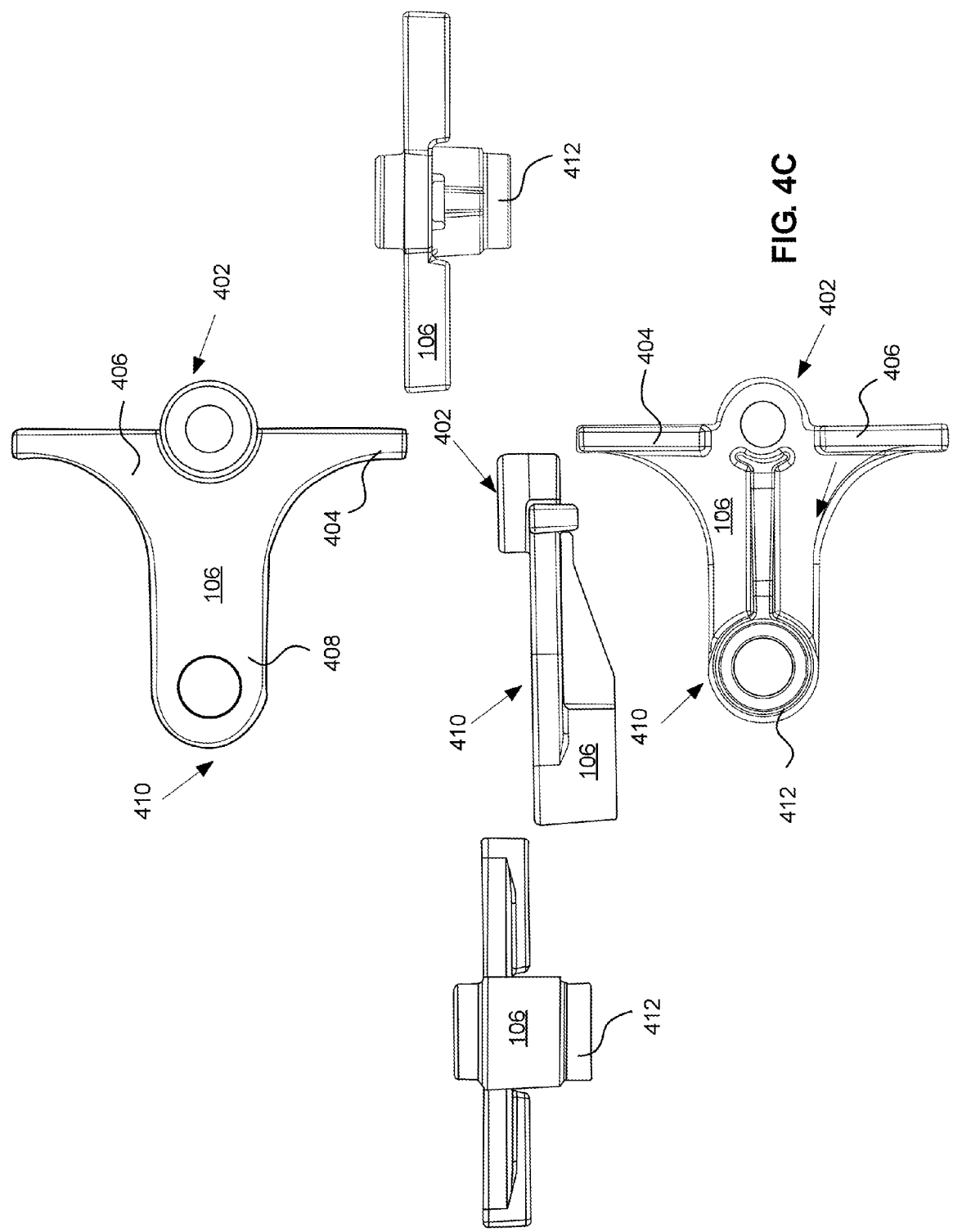

MODULE STACKING MECHANISM WITH INTEGRATED GROUND

FIELD OF THE INVENTION

The present disclosure relates generally to the technical field of computing, and more particularly, to components associated with printed circuit boards and methods for assembling them.

BACKGROUND

The background description provided herein is for the purpose of generally presenting the context of the disclosure. Unless otherwise indicated herein, the materials described in this section are not prior art to the claims in this application and are not admitted to be prior art or suggestions of the prior art, by inclusion in this section.

A printed circuit board (PCB) may provide a non-conductive substrate to mechanically support and electrically connect electronic components or structures fabricated in and/or secured on the PCB using, for example, conductive vias, tracks, pads, or other routing features. As devices including PCBs increase in complexity, and in some cases, also decrease in size over the years, the density of electronic components or structures on the PCBs may also increase. With finite amount of space available on PCBs, conventional techniques for positioning all of the desired electronic components or structures on PCBs may not be possible for certain computing needs.

BRIEF DESCRIPTION OF THE DRAWINGS

Embodiments will be readily understood by the following detailed description in conjunction with the accompanying drawings. The concepts described herein are illustrated by way of example and not by way of limitation in the accompanying figures. For simplicity and clarity of illustration, elements illustrated in the figures are not necessarily drawn to scale. Where considered appropriate, like reference labels designate corresponding or analogous elements.

FIG. 4C depicts top, bottom, and side views of the module stacking mechanism of FIG. 4A, according to some embodiments.

DETAILED DESCRIPTION

Figure 1:
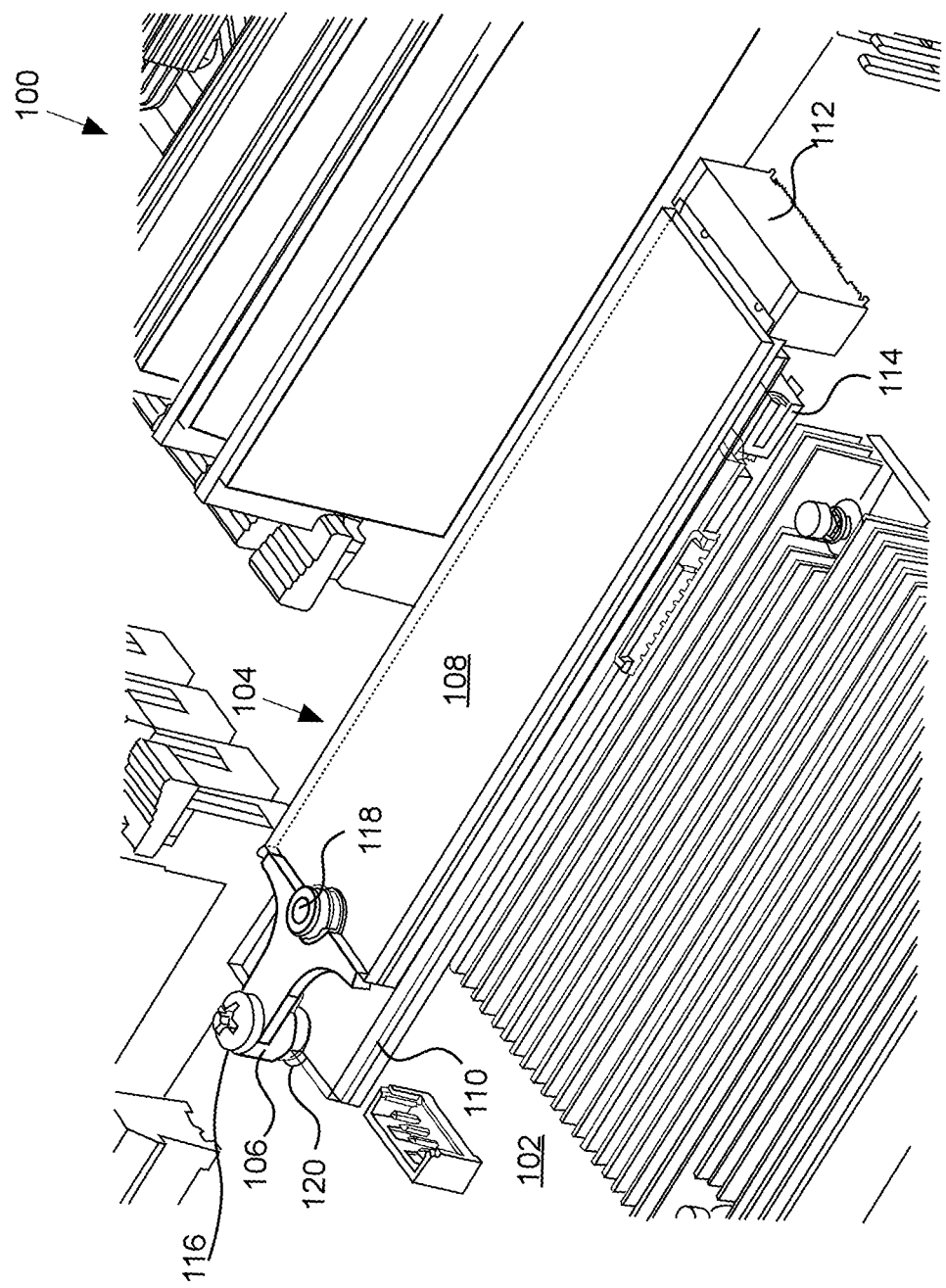
FIG. 1 depicts a perspective view of a portion of an example PCB assembly incorporating aspects of the present disclosure, according to some embodiments.

Embodiments of apparatuses and methods related to printed circuit board (PCB) assemblies are described. In embodiments, PCB assemblies may include a first mounting hole; first, second, and third projections radiating from the first mounting hole; and a second mounting hole adjacent to the third projection, the first and second mounting holes located at opposite ends of the third projection. The second mounting hole to cause an electrical coupling of a bottom integrated circuit (IC) module to a connection structure included in a printed circuit board (PCB). The first mounting hole, the first projection, and the second projection to cause positioning of a top IC module above the bottom IC module and electrical coupling of the top IC module to the connection structure. These and other aspects of the present disclosure will be more fully described below.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. Additionally, it should be appreciated that items included in a list in the form of "at least one A, B, and C" can mean (A); (B); (C); (A and B); (B and C); (A and C); or (A, B, and C). Similarly, items listed in the form of "at least one of A, B, or C" can mean (A); (B); (C); (A and B); (B and C); (A and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, it may not be included or may be combined with other features.

FIG. 1 depicts a perspective view of a portion of an example PCB assembly 100 incorporating aspects of the present disclosure, according to some embodiments. PCB assembly 100 may include a printed circuit board (PCB) 102 and a plurality of mechanical, electrical, and/or optical components or structures, such as, but not limited to, a structure 104. Structure 104, to be described in detail below, may include one or more sub-structures associated with mounting, positioning, and/or electrically coupling more than one integrated circuit (IC) module on the PCB 102 within relatively the same amount of space as conventionally occupied by a single IC module and without requiring more holes, mechanical mounts, and/or electrical couplers to the PCB 102 than for a single IC module. In some embodiments, structure 104 may include a module stacking mechanism or apparatus 106, a top IC module 108, a bottom IC module 110, a top module connector 112, a bottom module connector 114, a first mounting apparatus 116, a second mounting apparatus 118, and a PCB connection structure 120.

Top IC module 108 may be considered on top of or above the bottom IC module 110 in relation to the PCB 102 provided below the bottom IC module 110 (e.g., bottom IC module 110 may be provided in between the top IC module 108 and the PCB 102). When PCB assembly 100 may be oriented differently than shown in FIG. 1, such as the PCB 102 being oriented upside down (so that PCB 102 may be considered above both the top and bottom IC modules 108, 110) or on a side relative to that shown in FIG. 1 (so that PCB 102, bottom IC module 110, and top IC module 108 may be considered side-by-side relative to each other), designations of the "top" and "bottom" correspondingly changes relative to each other accordingly.

In some embodiments, PCB assembly 100 may comprise a motherboard included in a device or system such as, but not limited to, computers, laptops, smartphones, tablets, Internet of Things type devices, wearable devices, servers, workstations, mobile devices, and a variety of other computer devices, apparatuses, or systems.

Figure 2:
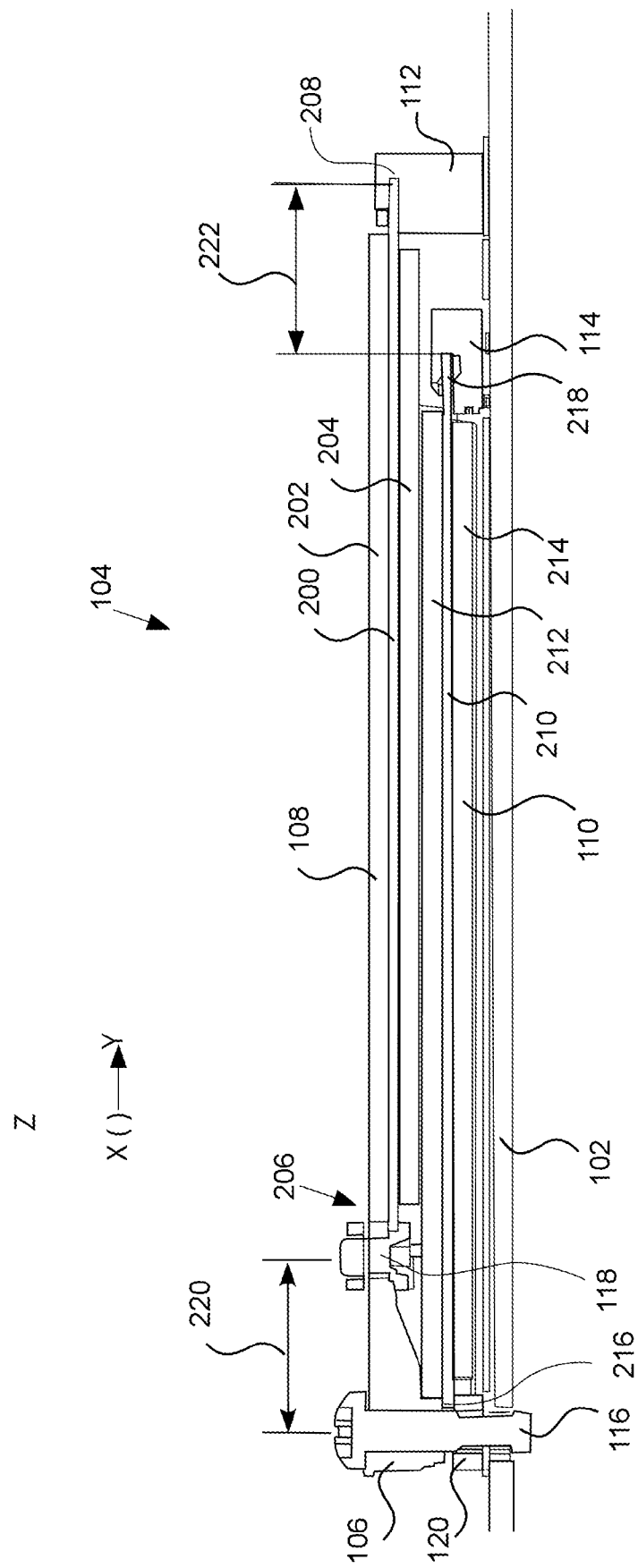
FIG. 2 depicts a cross-sectional view of a structure included in the PCB assembly of FIG. 1, according to some embodiments.

FIG. 2 depicts a cross-sectional view of the structure 104 positioned on the PCB 102, according to some embodiments. In some embodiments, bottom IC module 110 may be located between the top IC module 108 and the PCB 102. Top and bottom IC modules 108, 110 may be parallel or substantially parallel to the PCB 102. As described in greater detail below, top and bottom IC modules 108, 110 may be offset from each other by a certain amount along a direction parallel to the lengths of the top and bottom IC modules 108, 110.

Top IC module 108 may include a middle section 200 positioned between a top section 202 and a bottom section 204. In some embodiments, middle section 200 may comprise a PCB, and each of the top and bottom sections 202, 204 may include ICs, chips, trace patterns, electronic components, connectors, pins, and the like mounted and electrically coupled to the middle section 200. Details of the top and bottom sections 202, 204 are not depicted for ease of illustration. In alternative embodiments, one of the top or bottom sections 202, 204 may be omitted. When both the top and bottom sections 202, 204 are included in the top IC module 108, top IC module 108 may be referred to as a double layer or double sided IC module. When only the top or bottom section 202, 204 is included in the top IC module 108, top IC module 108 may be referred to as a single layer or single sided IC module. For instance, top IC module 108 may comprise a M.2 standard module, a solid state drive (SSD) module, a memory module, a M.2 S5 module (e.g., single layer module), a M.2 D5 module (e.g., double layer module), or the like. In some embodiments, the height or thickness of each of the top and bottom sections 202, 204 may be 1.5 millimeter (mm).

Top IC module 108 may further include a first end 206 and a second end 208 that is opposite to the first end 206. To be described in detail below, the first end 206 may couple with the module stacking mechanism 106. The second end 208 may include at least a plurality of pins that electrically couple with the top module connector 112. Top module connector 112, in turn, may be mounted and electrically coupled to the PCB 102. Top module connector 112 may also be referred to as a mating connector or edge connector for the top IC module 108. The plurality of pins located at second end 208 may facilitate transmission of input and output signals associated with the top IC module 108. When the plurality of pins are electrically coupled to corresponding contact areas of the top module connector 112, one or more electrical pathways may be provided between the top IC module 108 and the PCB 102. In some embodiments, the height of the top module connector 112, and in particular, the height of the contact areas of the top module connector 112, may be selected to facilitate positioning the top IC module 108 parallel or substantially parallel with the PCB 102, at a particular distance above the bottom IC module 110, provide at least a minimum separation distance or gap from the bottom IC module 110, and/or to align the first end 206 with the corresponding area of the module stacking mechanism 106.

Bottom IC module 110 may include a middle section 210, a top section 212, a bottom section 214, a first end 216, and a second end 218 similar to respective middle section 200, top section 202, bottom section 204, first end 206, and second end 208 of top IC module 108. First end 216 of bottom IC module 110 may couple with the module stacking mechanism 106. The second end 218 may include at least a plurality of pins to electrically couple with the bottom module connector 114. Bottom module connector 114, in turn, may be mounted and electrically coupled to the PCB 102. Bottom module connector 114 may also be referred to as a mating connector or edge connector for the bottom IC module 110. The plurality of pins located at second end 218 may facilitate transmission of input and output signals associated with the bottom IC module 110. When the plurality of pins are electrically coupled to corresponding contact areas of the bottom module connector 114, one or more electrical pathways may be provided between the bottom IC module 110 and the PCB 102. In some embodiments, the height of the bottom module connector 114, and in particular, the height of the contact areas of the bottom module connector 114, may be selected to facilitate positioning the bottom IC module 110 parallel or substantially parallel with the PCB 102, at a particular distance above the PCB 102, provide at least a minimum separation distance or gap with the top IC module 108, and/or to align the first end 216 with the corresponding area of the module stacking mechanism 106.

Figure 3:
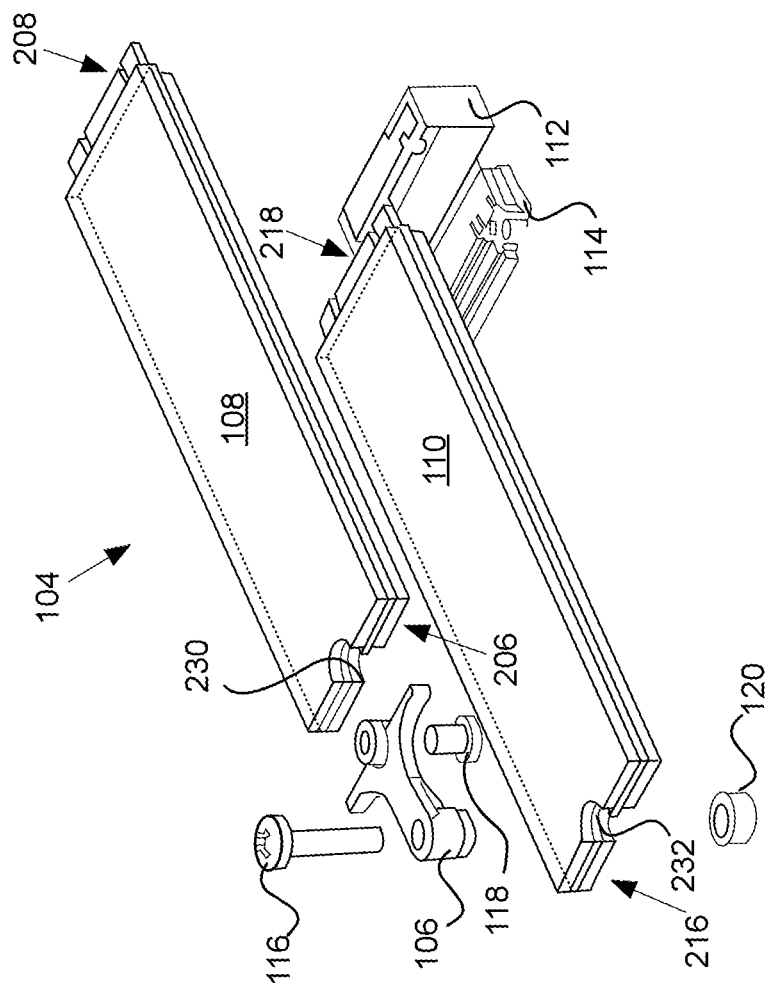
FIG. 3 depicts an exploded perspective view of the structure of FIG. 2, according to some embodiments.

FIG. 3 depicts an exploded perspective view of the structure 104, according to some embodiments. As shown, top and bottom IC modules 108, 110 may be rectangular in shape in the x-y plane. Each of first ends 206, 216 may include a straight side with an indentation in the center. The indentation may include a semicircular contact area 230 for top IC module 108 and a semicircular contact area 232 for bottom IC module 110. Semicircular contact areas 230, 232 may comprise a metallic or conductive material. Semicircular contact areas 230, 232 may be referred to as grounding areas or ground pads for the top and bottom IC modules 108, 110, respectively. In some embodiments, ground, grounding areas, ground pads, and the like may include floating grounds.

Semicircular contact area 230 is configured to be in physical contact with the second mounting apparatus 118, thereby establishing an electrical pathway to the PCB 102 via the second mounting apparatus 118, module stacking mechanism 106, first mounting apparatus 116, and PCB connection structure 120. In some embodiments, semicircular contact area 230 provides a grounding point for the top IC module 108, with the associated electrical pathway comprising a grounding pathway. Semicircular contact area 232 is configured to be in physical contact with the first mounting apparatus 116 and/or module stacking mechanism 106, thereby establishing an electrical pathway to the PCB 102 via the first mounting apparatus 116, module stacking mechanism 106, and PCB connection structure 120. In some embodiments, semicircular contact area 232 provides a grounding point for the bottom IC module 110, with the associated electrical pathway comprising a grounding pathway.

Returning to FIG. 2, in some embodiments, the top and bottom IC modules 108, 110 may be separated from each other by a certain separation distance or gap. A certain separation distance or gap may also exist between the bottom IC module 110 and the PCB 102. One or more components may exist within the space defined by the separation distance or gap between the bottom IC module 110 and PCB 102 (not shown). For example, top and bottom IC modules 108, 110 may have a separation distance or gap of approximately 0.25 mm or greater. The bottom IC module 110 may be approximately 0.9 mm or greater above the PCB 102. In some embodiments, depending on whether one or both of the top and bottom IC modules 108, 110 may be single or double sided IC modules, the separation distance or gap between the top and bottom IC modules 108, 110 and/or between the bottom IC module 110 and PCB 102 may vary accordingly. For instance, if the top IC module 108 comprises a single sided IC module with no bottom section 204 and the bottom IC module 110 comprises a single sided IC module with no bottom section 214, then the separation distance or gap between the top and bottom IC modules 108, 110 may be approximately 1.75 mm and the separation distance or gap between the bottom IC module 110 and PCB 102 may be approximately 2.4 mm.

In some embodiments, top and bottom IC modules 108, 110 may comprise an offset stacked structure, in which the first ends 206, 216 may be separated from each other in a direction along the lengths of the top and bottom IC modules 108, 110 (e.g., y-direction in a Cartesian coordinate system) by approximately a distance 220. In particular, distance 220 may comprise the distance between the centers of the first mounting apparatus 116 and the second mounting apparatus 118. In some embodiments, distance 220 may equal (or approximately equal) a distance 222 between the second ends 208, 218, and in particular, the ends of the pins included in second ends 208, 218. Distance 220 may equal or approximately equal distance 222 when, for example, the lengths of top and bottom IC modules 108, 110 are the same (or approximately the same).

Top and bottom IC modules 108, 110 may be the same or different from each other. For instance, in some embodiments, both the top and bottom IC modules 108, 110 may comprise double sided IC modules. In other embodiments, one of the top or bottom IC modules 108, 110 may comprise a single sided IC module and the other of the top or bottom IC modules 108, 110 may comprise a double sided IC module. In still other embodiments, both the top and bottom IC modules 108, 110 may comprise single sided IC modules.

The size of the top and bottom IC modules 108, 110 may be the same or different from each other. For example, the lengths of the top and bottom IC modules 108, 110 (e.g., dimension along the y-direction) may be the same or different from each other. The types of components included in the top and bottom IC modules 108, 110 may be the same or different from each other. For instance, the top and bottom IC modules 108, 110 may both comprise SSDs, one may comprise a memory while the other comprises a non-memory component (e.g., a processor, application specific integrated circuit (ASIC), etc.), one may comprise a first type of memory while the other comprises a second type of memory different from the first type of memory, and the like. In some embodiments, even if the top and bottom IC modules 108, 110 comprise the same type of components, their capacities may be the same or different from each other. For instance, if top and bottom IC modules 108, 110 comprise SSDs, top IC module 108 may comprise a 1 terabyte (TB) SSD and the bottom IC module 110 may comprise a 2 TB SSD. Alternatively, each of the top and bottom IC modules 108, 110 may comprise a 1 TB memory.

The module stacking mechanism 106 may couple with the first end 206 of the top IC module 108 using the second mounting apparatus 118. In some embodiments, as described in detail below, the module stacking mechanism 106 and/or second mounting apparatus 118 may electrically couple, attach, mount, secure, and/or position the top IC module 108 to the PCB 102. The module stacking mechanism 106 may also couple with the first end 216 of the bottom IC module 110 using the first mounting apparatus 116. In some embodiments, as described in detail below, the module stacking mechanism 106 and/or first mounting apparatus 116 may electrically couple, attach, mount, secure, and/or position the bottom IC module 110 to the PCB 102.

First mounting apparatus 116 may insert into and extend along a z-direction of the module stacking mechanism 106. First mounting apparatus 116 may be longer in length (along the z-direction) than the module stacking mechanism 106, such that it extends through the module stacking mechanism 106 and into the PCB connection structure 120 (and also optionally at least a portion of the PCB 102). PCB connection structure 120 (also referred to as an electrical grounding structure) may be positioned within a single hole included in the PCB 102. Securement between the first mounting apparatus 116 and PCB connection structure 120, in turn, may attach, mount, or secure both the top and bottom IC modules 108, 110 to the PCB 102.

In some embodiments, first and second mounting apparatuses 116, 118 and PCB connection structure 120 may comprise metallic or conductive material. When, for example, the top and bottom IC modules 108, 110 comprise M.2 standard modules, first and second mounting apparatuses 116, 118 may comprise M.2 standard mounting screws and the PCB connection structure 120 may comprise a single standoff conforming to the M.2 standard having a height of approximately 2.55 mm. Although first and second mounting apparatuses 116, 118 may be depicted as screws, other types of fasteners such as friction fit fasteners or the like may be used instead.

Figure 4A:
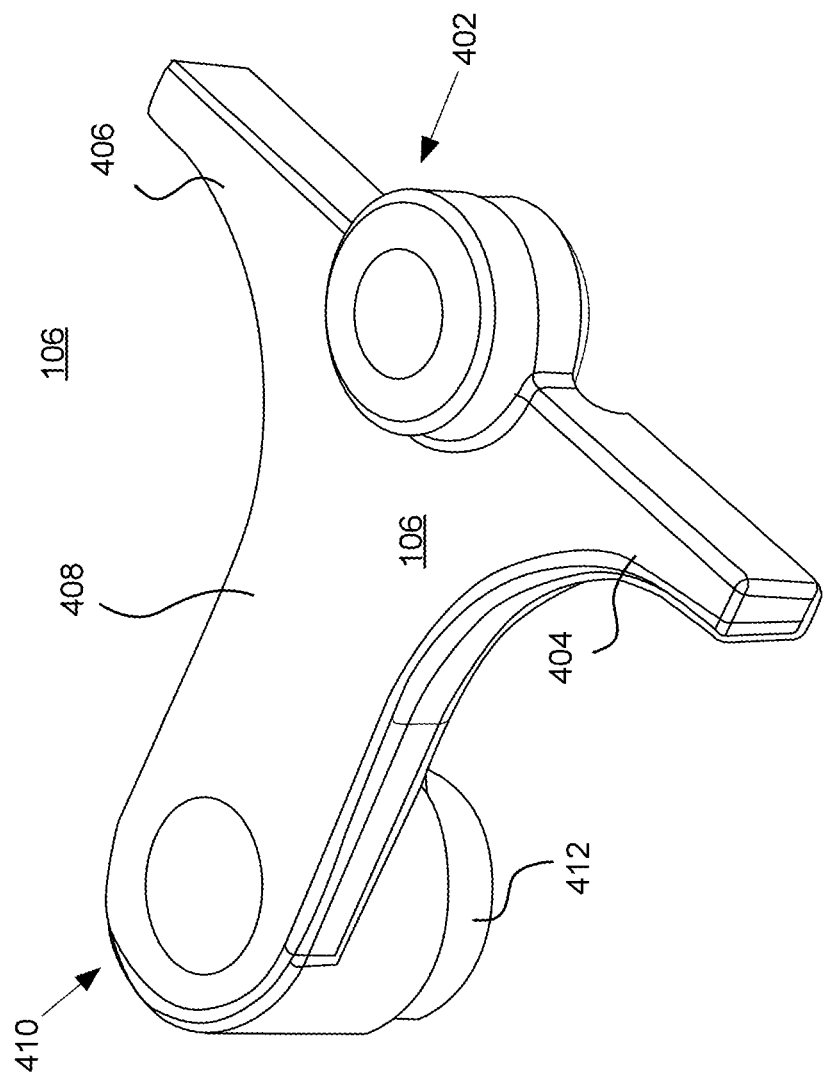
FIG. 4A depicts a perspective top view of a module stacking mechanism, according to some embodiments.
Figure 4B:
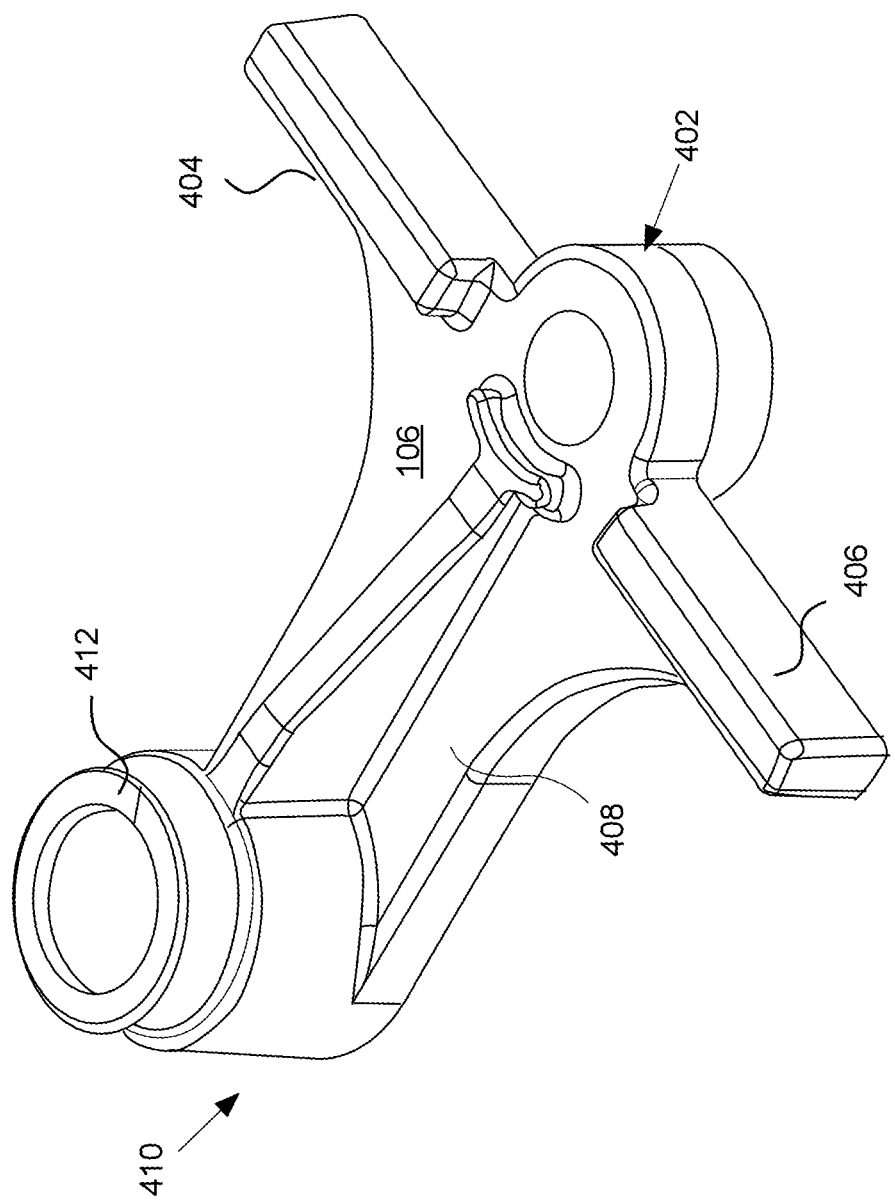
FIG. 4B depicts a perspective bottom view of the module stacking mechanism of FIG. 4A, according to some embodiments.

Module stacking mechanism 106 is described in greater detail in conjunction with FIGS. 4A-4C. FIG. 4A depicts a perspective top view of the module stacking mechanism 106, according to some embodiments. FIG. 4B depicts a perspective bottom view of the module stacking mechanism 106, according to some embodiments. FIG. 4C depicts top, bottom, and side views of the module stacking mechanism 106, according to some embodiments.

In some embodiments, module stacking mechanism 106 may comprise a unitary structure. Module stacking mechanism 106 may include a first mounting hole 402; first, second, and third projections 404, 406, 408; a second mounting hole 410; and a fourth projection 412. Module stacking mechanism 106 may also be referred to as a module mounting extender, module stacking extender, module extender, and the like.

The first mounting hole 402 may be adjacent to the first end 206 of the top IC module 108. First, second, and third projections 404, 406, 408 may radiate from the first mounting hole 402 and lie in the same plane relative to each other. First projection 404 may be adjacent to a first side of the first mounting hole 402, the second projection 406 may be adjacent to a second side of the first mounting hole 402 that is substantially opposite to the first side, and the third projection 408 may be adjacent to a third side of the first mounting hole 402. In some embodiments, third projection 408 may be perpendicular or substantially perpendicular to the first and second projections 404, 406. In some embodiments, first, second, and third projections 404, 406, 408 may form a structure similar to spokes of a wheel that are located at the 0 degree, 90 degree, and 180 degree positions relative to the first mounting hole 402. The second mounting hole 410 may be adjacent to the third projection 408, in which the first and second mounting holes 402, 210 may be located at opposite ends of the third projection 408.

In some embodiments, first and second projections 404, 406 may comprise anti-rotational wings or bars configured to support and/or maintain alignment of the first mounting hole 402 with the top IC module 108. As shown in FIG. 2, first and second projections 404, 406 may abut the first end 206 of the top IC module 108 to, among other things, prevent the top IC module 108 from rotating relative to the module stacking mechanism 106. In some embodiments, the length of the module stacking mechanism 106 from one end of the first projection 404 to the opposite end of the second projection 406 may be approximately the same as a width of the top IC module 108 (e.g., dimension along the x-direction).

Although the width of the third projection 408 is shown wider than that of the first or second projections 404, 406, it is contemplated that the third projection 408 may be narrower in width or have a narrower width in the portions in between the first and second mounting holes 402, 410.

In some embodiments, the length of the third projection 408 may be approximately equal to distance 220, distance 222, a distance from the PCB connection structure 120 to first end 206, a distance between the second ends 208 and 218, or the like.

The fourth projection 412 may be located below and circumferential to the second mounting hole 410. Fourth projection 412 may form a collar below the second mounting hole 410. The fourth projection 412 may have a certain height or thickness to facilitate proper positioning of the top and bottom IC modules relative to each other, to accommodate the dimensions of the bottom IC module 110, to provide a contact point with the semicircular contact area 232 of the bottom IC module 110 (see FIG. 2), to aid in securing the first mounting apparatus 116 to the module stacking mechanism 106 and/or PCB connection structure 120, and the like. Each of the first and second mounting holes 402, 410 may also have a certain height or thickness to sufficiently receive and attach to the respective mounting apparatuses 118, 116; facilitate positioning of the top and bottom IC modules 108, 110; facilitate electrical coupling with respective first ends 206, 216; and the like.

The insides of the first and second mounting holes 402, 410 may be configured to specifically receive, contact, and/or attach to the second and first mounting apparatuses 118, 116, respectively. In some embodiments, the underside of the first mounting hole 402 may also couple to the second mounting apparatus 118 and/or the first end 206 (or at least the semicircular contact area 230) of the top IC module 108. The underside of the second mounting hole 410 may couple to the first end 216 (or at least the semicircular contact area 232) of the bottom IC module 110 and/or the PCB connection structure 120. In some embodiments, the centers of the second mounting hole 410, first mounting apparatus 116, and PCB connection structure 120 may be co-linearly located relative to each other, so that the structure 104 may be mounted and grounded to the PCB 102 via a single PCB hole associated with the PCB connection structure 120.

In some embodiments, one or more portions of the module stacking mechanism 106, such as, but not limited to, the third projection 408, first mounting hole 402, or second mounting hole 410, may include additional material (or sufficient amount of material) for purposes of structural rigidity or integrity, mechanical stability, thermal dissipation, ease of fabrication, and the like. The underside of the third projection 408, for instance, may include a brace or rib for just such purpose (see FIG. 4B). As another example, module stacking mechanism 106 may be capable of withstanding at least a 50 standard gravity (g) shock without incurring damage or loss of functionality. Module stacking mechanism 106 may include one or more indentations, cutouts, contouring, and the like to be compatible with "keep out" zones of the top and/or bottom IC modules 108, 110 (e.g., to provide sufficient clearance for components included in the top and/or bottom IC modules 108, 110). Module stacking mechanism 106 may also be sized overall to be compatible with possible "keep out" zones of the PCB 102.

In some embodiments, module stacking mechanism 106 may comprise metallic or conductive material fabricated using die casting or sheet metaling techniques. For example, module stacking mechanism 106 may comprise aluminum, nickel-plated steel, a metal alloy, or the like. Module stacking mechanism 106 may also be referred to as a module support mechanism, a support mechanism with integrated ground, and the like.

Figure 5:
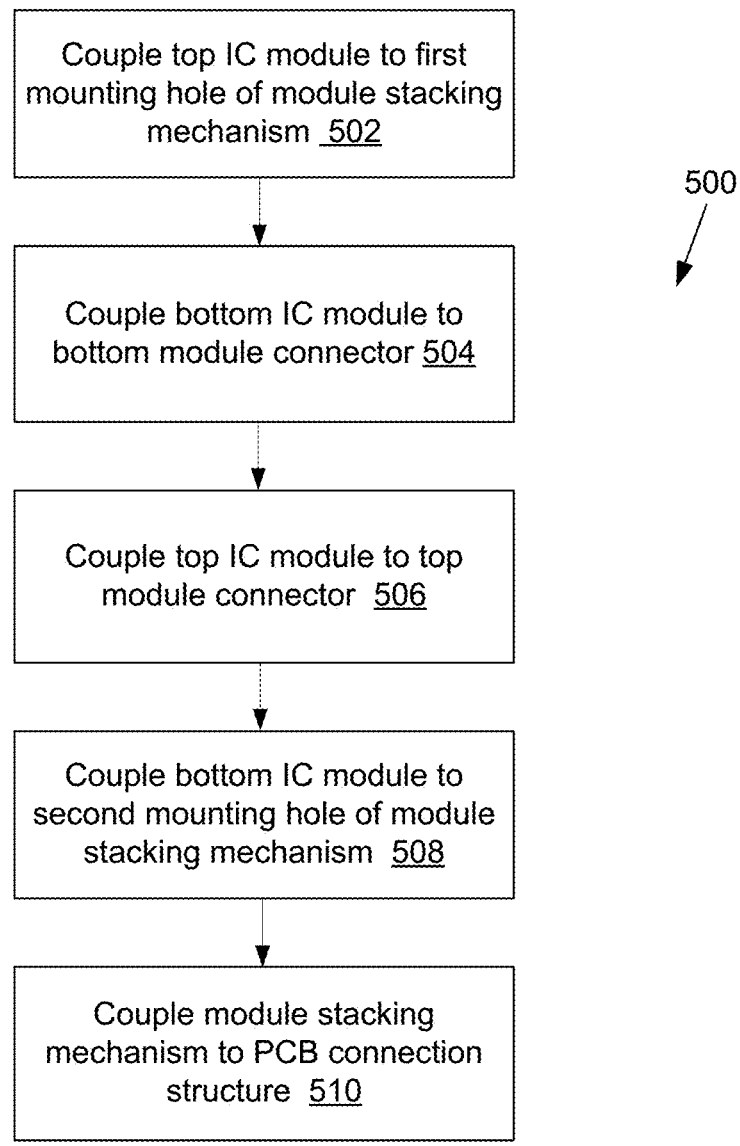
FIG. 5 depicts an example process for forming a structure on a PCB, according to some embodiments.

FIG. 5 depicts an example process 500 for forming the structure 104 on the PCB 102, according to some embodiments. FIG. 6A-6E depict example perspective views of the structure 104 and/or PCB 102 during the assembling process, according to some embodiments.

Figure 6A:
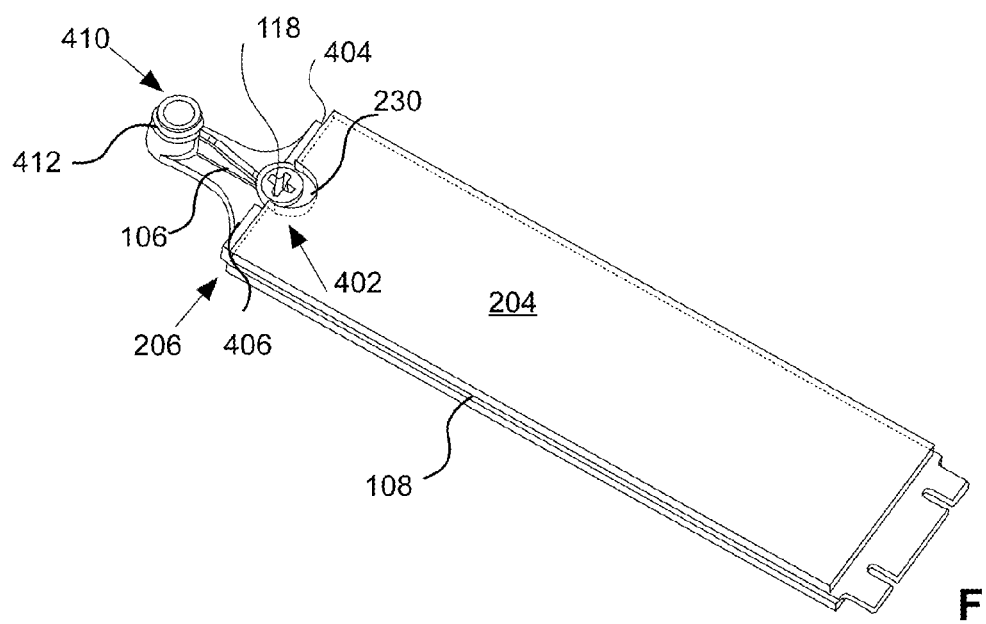
FIG. 6A-6E depict example perspective views of the structure and/or PCB during the assembling process, according to some embodiments.

At a block 502 of FIG. 5, top IC module 108 may be coupled to the first mounting hole 402 of the module stacking mechanism 106 using the second mounting apparatus 118. In some embodiments, top IC module 108 and module stacking mechanism 106 may be flipped such that their undersides face upward, as shown in FIG. 6A. First end 206 of the top IC module 108 may be placed in contact with first and second projections 404, 406 and first mounting hole 402, with semicircular contact area 230 aligned with the first mounting hole 402. Then second mounting apparatus 118 may be inserted into the first mounting hole 402 to mount and electrically couple the top IC module 108 to the module stacking mechanism 106. In some embodiments, when the second mounting apparatus 118 comprises a screw, such as a M.2 standard mounting screw, the screw head may be in electrical contact with the semicircular contact area 230 and positioned adjacent to or in contact with an underside surface of the first mounting hole 402; the screw thread may be located within the first mounting hole 402; and the screw tip may be located proximate a top surface of the first mounting hole 402 that is opposite to the underside surface.

Figure 6B:
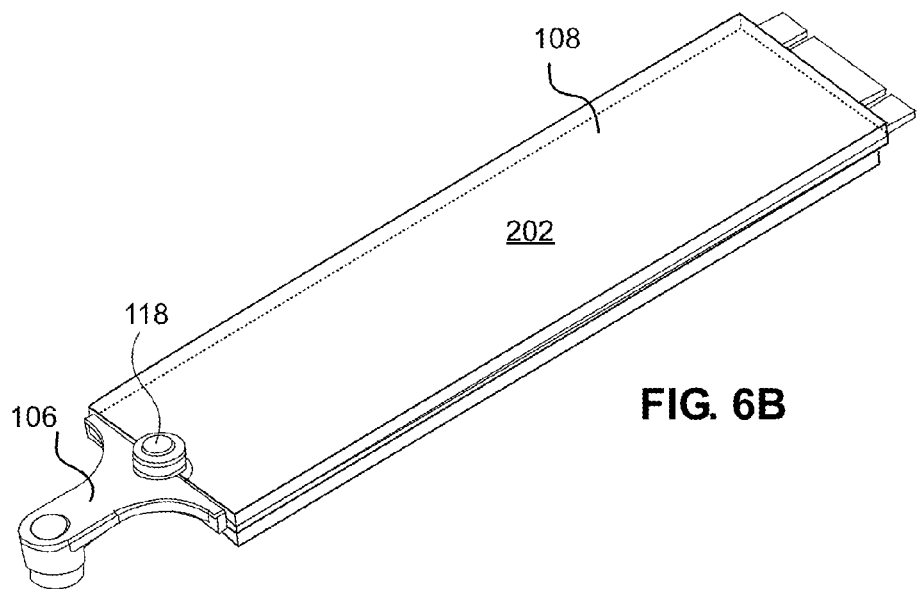

FIG. 6B depicts the top IC module 108 coupled to the module stacking mechanism 106, in which both are flipped relative to that shown in FIG. 6A, such that the top section 202 of the top IC module 108 faces upward. As such, the screw tip of the second mounting apparatus 118 is shown instead of the screw head shown in FIG. 6A.

Next, at block 504, bottom IC module 110 may be coupled to the bottom module connector 114 which is attached to the PCB 102. The plurality of pins included in the second end 218 of the bottom IC module 110 may electrically couple to the corresponding contact areas of the bottom module connector 114. At block 506, top IC module 110 may be coupled to the top module connector 112 which is attached to the PCB 102. The plurality of pins included in the second end 208 of the top IC module 108 may electrically couple to the corresponding contact areas of the top module connector 112.

Figure 6C:
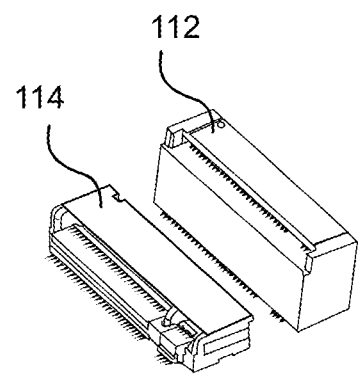
Figure 6D:
Figure 6D:
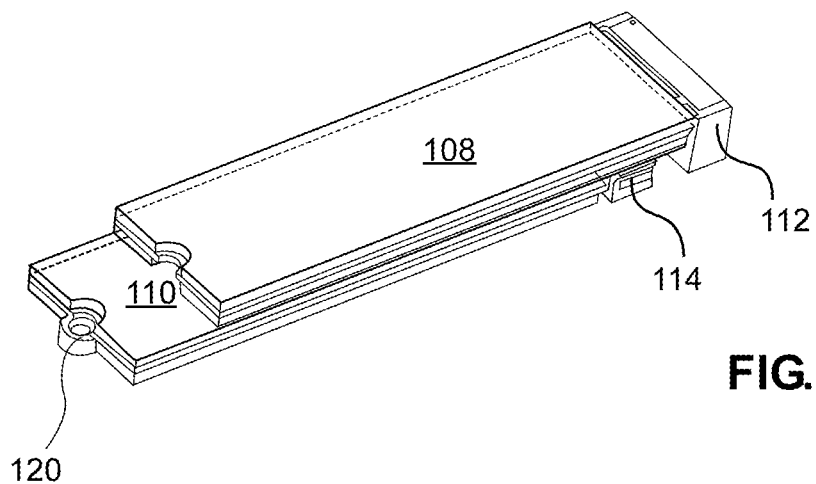

FIG. 6C depicts the top and bottom module connectors 112, 114 as well as the PCB connection structure 120 attached to the PCB 102 prior to coupling with top and bottom IC modules 108, 110. FIG. 6D depicts an interim version of the structure 104, after the top and bottom IC modules 108, 110 have been coupled to the top and bottom module connectors 112, 114, respectively. Note the PCB connection structure 120 aligning with the indentation or semicircular contact area 232 of the bottom IC module 110. Also note that the module stacking mechanism 106 and second mounting apparatus 118 are not shown for purpose of ease of illustration and discussion.

Figure 6E:
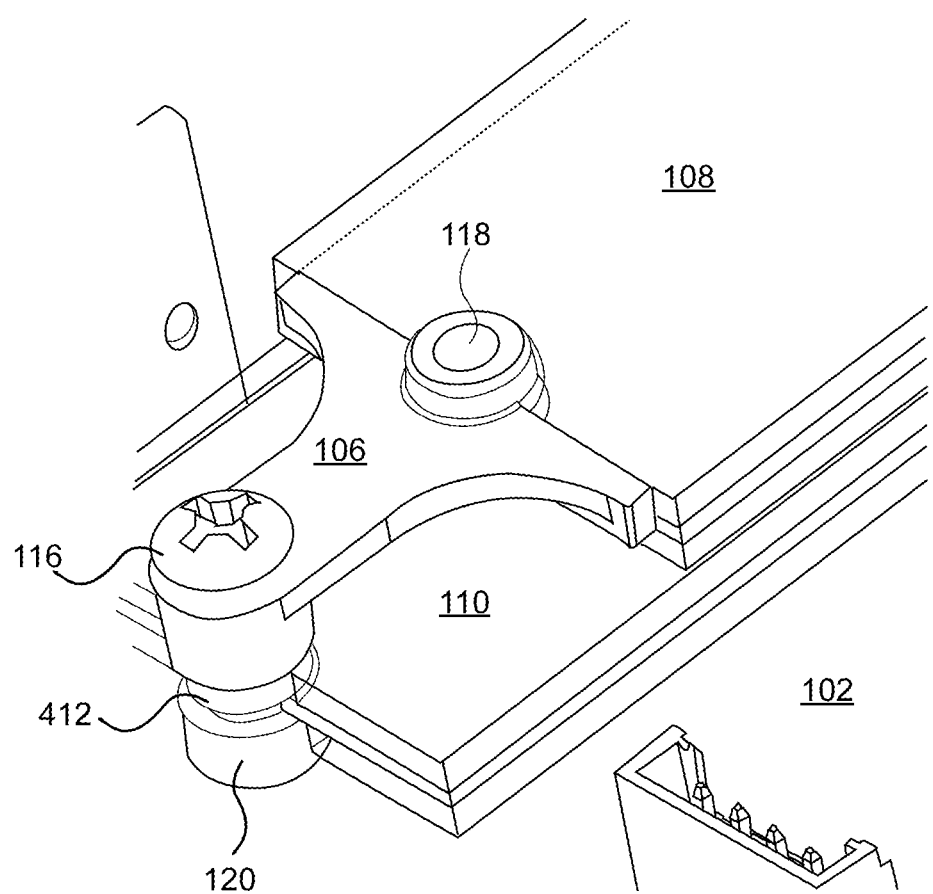

Next at block 508, bottom IC module 110 may couple to the second mounting hole 410 of the module stacking mechanism 106 via the first mounting apparatus 116, as shown in FIG. 6E. In some embodiments, semicircular contact area 232 of the bottom IC module 110 may be placed in contact with or adjacent to the fourth projection 412. In some embodiments, module stacking mechanism 106 may automatically align with the bottom IC module 110 and PCB connection structure 120 upon performance of blocks 502-508. First mounting apparatus 116 may be inserted into the second mounting hole 410 to mount and electrically couple the bottom IC module 110 to the PCB 102.

Insertion of the first mounting apparatus 116 into the second mounting hole 410 may continue to cause simultaneous insertion of the first mounting apparatus 116 into the PCB connection structure 120. Hence, the top and bottom IC modules 108, 110 and module stacking mechanism 106 may be mounted and electrically coupled to the PCB 102.

In some embodiments, when the first mounting apparatus 116 comprises a screw, such as a M.2 standard mounting screw, the screw head may be adjacent to a top surface of the second mounting hole 410; the screw thread may be located within and be in electrical contact with the interiors of the first mounting hole 410 and the PCB connection structure 120; and the screw tip may be located proximate the PCB connection structure 120 and/or within the PCB 102. Accordingly, secure grounding pathways may be simultaneously established between the top IC module 108 and the PCB 102 and between the bottom IC module 110 and the PCB 102, without requiring two grounding holes in the PCB 102, two PCB connection structures, changes to the IC modules, or space on the PCB 102 of approximately twice the areas of the top and bottom IC modules 108, 110. Among other things, sharing a single grounding hole in the PCB 102 by two IC modules, avoids having to drill an additional hole in the PCB 102 which may interfere with routing or trace patterns on and/or in the PCB 102.

In alternative embodiments, orientation of the first and second mounting apparatuses 116, 118 may be different than discussed above. For example, if the first and second mounting apparatuses 116, 118 comprise screws, then both screw heads may be positioned along a top side of the module stacking mechanism 106, both screw heads may be positioned along an underside of the module stacking mechanism 106, or the screw head of the first mounting apparatus 116 may be located at an underside of the module stacking mechanism 106 while the screw head of the second mounting apparatus 118 may be located at a top side of the module stacking mechanism 106. Alternatively in FIG. 5, block 502 may be performed after block 506.

Figure 7:
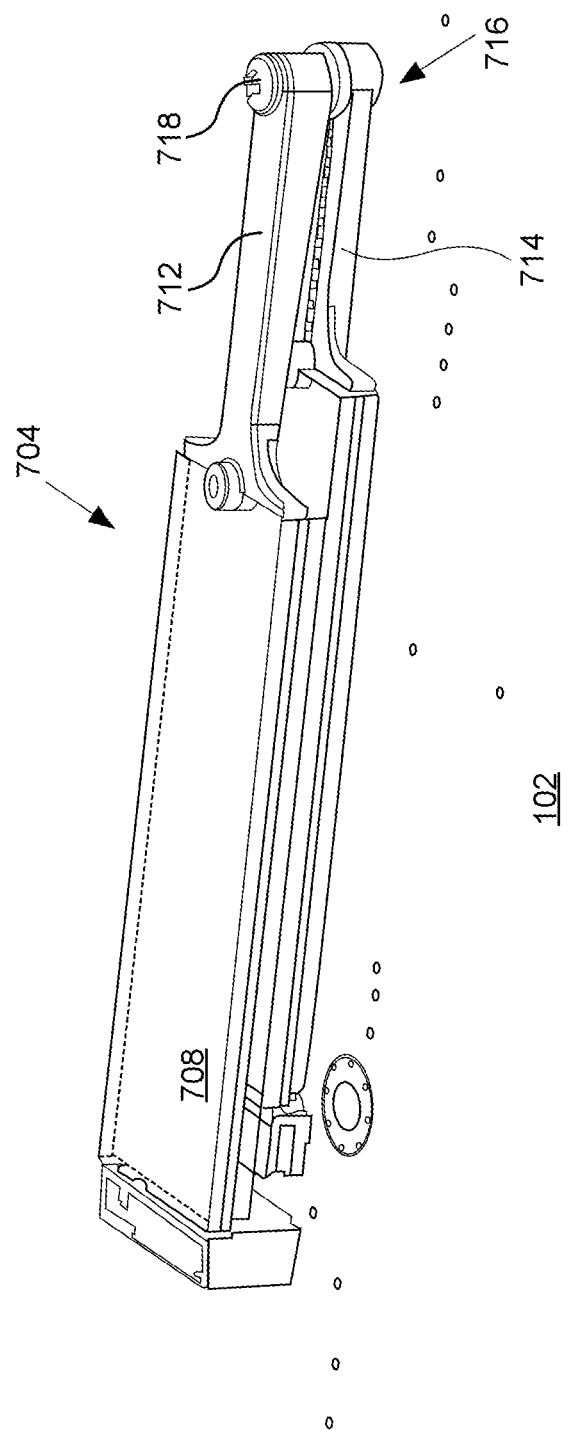
FIG. 7 depicts an example structure attached to the PCB, according to alternative embodiments.

FIG. 7 depicts an example structure 704 attached to the PCB 102, according to alternative embodiments. Structure 704 may be similar to structure 104, except two module stacking mechanisms may be included in structure 704. A top module stacking mechanism 712 may couple to a top IC module 708, and a bottom stacking mechanism 714 may couple to a bottom IC module 710. Ends of the top and bottom module stacking mechanisms 712, 714 that are opposite to the ends coupled to the top and bottom IC modules 708, 710, respectively, may include top and bottom mounting holes, respectively, through which a mounting apparatus 718 (e.g., a screw or a fastener) may be inserted to attach and electrically couple (e.g., ground) the top and bottom IC modules 708, 710 to the PCB 102. Mounting apparatus 718 may further extend into a single hole 716 of the PCB 102 to complete the attachment and electrical coupling. Alternatively, a PCB connection structure may be provided on the PCB 102, and the mounting apparatus 718 may couple to such PCB connection structure.

In some embodiments, top IC module 708 and top module stacking mechanism 712 may be collinear with each other, and bottom IC module 710 and bottom module stacking mechanism 714 may be collinear with each other. Top IC module 708 may be stacked above and offset from the bottom IC module 710. Likewise, top module stacking mechanism 712 may be stacked above the bottom module stacking mechanism 714, with the top and bottom mounting holes associated with the respective top and bottom module stacking mechanisms 712, 714 in alignment with each other (e.g., top mounting hole is stacked directly above the bottom mounting hole). In some embodiments, the length of the top module stacking mechanism 712 may be greater than the length of the bottom module stacking mechanism 714. Accordingly, a portion of the top module stacking mechanism 712 may be located above the bottom IC module 710.

In some embodiments, the sizes of the top and bottom IC modules 708, 710 may be the same or different from each other. For example, the length of the top and bottom IC modules 708, 710 may be different from each other. If, for instance, top and bottom IC modules 708, 710 comprise M.2 standard modules (e.g., SSD M.2 modules), then when one of the top and bottom IC modules 708, 710 may have a longer length than the other module, the longer length module may have a different capacity or functionality than the shorter length module (e.g., greater SSD capacity for the longer length module relative to the shorter length module).

In some embodiments, structure 704 may be configured to accommodate IC modules of any length up to a maximum length. The single hole 716 of the PCB 102 may be located a particular distance, corresponding to the maximum length, away from the module connectors, and top and bottom module stacking mechanisms 712, 714 of appropriate lengths may be used depending on the particular length of the top and bottom IC modules 708, 710, respectively, to attach to the top and bottom IC modules 708, 710, respectively, and also the single hole 716. For instance, if top and bottom IC modules 708, 710 comprise M.2 standard modules, top and bottom IC modules 708, 710 may have a length of 42, 60, 80, or 110 mm. The single hole 716 may be located suitable for handling up to a 110 mm length bottom IC module 710. Then if top and bottom IC modules 708, 710 comprise 60 mm length modules, then bottom module stacking mechanism 714 may be approximately 50 mm in length and the top module stacking mechanism 712 may have a length of approximately 50 mm plus the amount of stacked offset between the top and bottom IC modules 708, 710. In another example, the top IC module 708 may be shorter or longer in length than the bottom IC module 710 and each of the top and bottom modular stacking mechanisms 712, 714 of appropriate length may be selected to fully extend the distance between the edge of the IC module and the single hole 716.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Illustrative examples of the devices, systems, and methods of various embodiments disclosed herein are provided below. An embodiment of the devices, systems, and methods may include any one or more, and any combination of, the examples described below.

Example 1 is an apparatus including a first mounting hole; first, second, and third projections radiating from the first mounting hole; and a second mounting hole adjacent to the third projection, the first and second mounting holes located at opposite ends of the third projection; wherein the second mounting hole to cause an electrical coupling of a bottom integrated circuit (IC) module to a connection structure included in a printed circuit board (PCB), wherein the first mounting hole, the first projection, and the second projection to cause positioning of a top IC module above the bottom IC module and electrical coupling of the top IC module to the connection structure.

Example 2 may include the subject matter of Example 1, and may further include wherein the first projection is adjacent to a first side of the first mounting hole, the second projection is adjacent to a second side of the first mounting hole that is substantially opposite to the first side, and the third projection is adjacent to a third side of the first mounting hole and is substantially perpendicular to the first and second projections.

Example 3 may include the subject matter of any of Examples 1-2, and may further include wherein the first and second mounting holes and the first, second, and third projections comprise a unitary structure, the unitary structure comprising a module stacking mechanism with integrated ground.

Example 4 may include the subject matter of any of Examples 1-3, and may further include wherein the unitary structure comprises a metallic or conductive material.

Example 5 may include the subject matter of any of Examples 1-4, and may further include a fourth projection located below and circumferential to the second mounting hole, the fourth projection having a height to cause positioning of the top IC module above the bottom IC module.

Example 6 may include the subject matter of any of Examples 1-5, and may further include wherein one or more of the first mounting hole, the first projection, the second projection, and the fourth projection to cause a spacing between the top and bottom IC modules.

Example 7 may include the subject matter of any of Examples 1-6, and may further include wherein the top IC module and the PCB are substantially parallel to each other.

Example 8 may include the subject matter of any of Examples 1-7, and may further include wherein the bottom and top IC modules include M.2 standard modules, and the first and second mounting holes include M.2 standard mounting screw holes.

Example 9 may include the subject matter of any of Examples 1-8, and may further include wherein the connection structure includes a single standoff.

Example 10 may include the subject matter of any of Examples 1-9, and may further include wherein a length of the third projection is approximately equal to a distance from the connection structure to an edge of the top IC module closest to the first mounting hole.

Example 11 may include the subject matter of any of Examples 1-10, and may further include wherein the length of the third projection is approximately equal to a distance between pins located at edges of the top and bottom IC modules that are opposite to the edge of the top IC module closest to the connection structure.

Example 12 is a method including coupling first ends of a bottom integrated circuit (IC) module and a top IC module to a bottom module connector and a top module connector, respectively, wherein the bottom and top module connectors are electrically coupled to a printed circuit board (PCB), and wherein the top IC module is stacked above the bottom IC module; coupling a second end, that is opposite to the first end, of the top IC module to a first mounting hole of a unitary module stacking mechanism; coupling a second end, that is opposite to the first end, of the bottom IC module to a second mounting hole of the unitary module stacking mechanism; and coupling the unitary module stacking mechanism to a single hole included in the PCB.

Example 13 may include the subject matter of Example 12, and may further include wherein coupling the second end of the top IC module to the first mounting hole comprises securing and electrically coupling the top IC module to the unitary module stacking mechanism.

Example 14 may include the subject matter of any of Examples 12-13, and may further include wherein electrically coupling the top IC module to the unitary module stacking mechanism comprises establishing an electrical ground path between the top IC module and the PCB.

Example 15 may include the subject matter of any of Examples 12-14, and may further include wherein coupling the second end of the bottom IC module to the second mounting hole comprises securing and electrically coupling the bottom IC module to the unitary module stacking mechanism.

Example 16 may include the subject matter of any of Examples 12-15, and may further include wherein electrically coupling the bottom IC module to the unitary module stacking mechanism comprises establishing an electrical ground path between the bottom IC module and the PCB.

Example 17 may include the subject matter of any of Examples 12-16, and may further include wherein coupling the unitary module stacking mechanism to the single hole included in the PCB comprises securing and establishing an electrical ground path for the top and bottom IC modules to the PCB.

Example 18 may include the subject matter of any of Examples 12-17, and may further include wherein coupling the second end of the top IC module to the first mounting hole comprises attaching a fastener in the first mounting hole, wherein one or both of a portion of the unitary module stacking mechanism adjacent to the first mounting hole or the fastener electrically couples to a grounding contact area included in the second end of the top IC module.

Example 19 may include the subject matter of any of Examples 12-18, and may further include wherein coupling the second end of the bottom IC module to the second mounting hole comprises attaching a fastener in the second mounting hole, wherein one or both of a portion of the unitary module stacking mechanism adjacent to the second mounting hole or the fastener electrically couples to a grounding contact area included in the second end of the bottom IC module.

Example 20 may include the subject matter of any of Examples 12-19, and may further include wherein coupling the unitary module stacking mechanism to the single hole comprises attaching the fastener to a PCB connection structure located at the single hole, wherein the PCB connection structure is electrically coupled to the PCB.

Example 21 may include the subject matter of any of Examples 12-20, and may further include wherein the top and bottom IC modules comprise M.2 standard modules.

Example 22 is a computer device including a printed circuit board (PCB) including an electrical grounding structure, a top module connector, and a bottom module connector, wherein the electrical grounding structure is located at a first portion of the PCB and the top and bottom module connectors are located at a second portion of the PCB; a top integrated circuit (IC) module electrically coupled to the top module connector; a bottom IC module stacked below the top IC module and electrically coupled to the bottom module connector; and a module stacking mechanism coupled to the top and bottom IC modules and to the electrical grounding structure.

Example 23 may include the subject matter of Example 22, and may further include a first mounting apparatus coupled to the module stacking mechanism, the electrical grounding structure, and the bottom IC module, wherein an electrical grounding path exists between the top IC module and the PCB and between the bottom IC module and the PCB.

Example 24 may include the subject matter of any of Examples 22-23, and may further include wherein the first mounting apparatus comprises a fastener that inserts into the module stacking mechanism and the electrical grounding structure.

Example 25 may include the subject matter of any of Examples 22-24, and may further include a second mounting apparatus coupled to the module stacking mechanism and the top IC module.

Example 26 may include the subject matter of any of Examples 22-25, and may further include wherein the module stacking mechanism comprises metallic or conductive material.

Example 27 may include the subject matter of any of Examples 22-26, and may further include wherein the top and bottom IC modules comprise M.2 standard modules.

Example 28 may include the subject matter of any of Examples 22-27, and may further include wherein the top and bottom IC modules comprise solid state drive (SSD) modules.

Example 29 may include the subject matter of any of Examples 22-28, and may further include wherein a memory capacity associated with the top IC module is the same or different than a memory capacity associated with the bottom IC modules.

Example 30 may include the subject matter of any of Examples 22-29, and may further include wherein the top and bottom IC modules are the same size relative to each other.

Example 31 may include the subject matter of any of Examples 22-30, and may further include wherein the top and bottom IC modules are different sizes relative to each other.

Example 32 may include the subject matter of any of Examples 22-31, and may further include wherein the module stacking mechanism maintains a gap distance between the top and bottom IC modules.

Example 33 may include the subject matter of any of Examples 22-32, and may further include wherein the module stacking mechanism maintains a gap distance between the bottom IC module and the PCB.

Example 34 may include the subject matter of any of Examples 22-33, and may further include wherein the module stacking mechanism includes a pair of projections in contact with an edge of the top IC module, the pair of projections to stabilize positioning of the top IC module relative to the bottom IC module, to prevent rotation of the top IC module relative to the module stacking mechanism, or to automatically align a mounting hole included in the module stacking mechanism with the electrical grounding structure.

Example 35 is an apparatus including a first means for coupling; first, second, and third means for supporting radiating from the first means for coupling; and a second means for coupling adjacent to the third means for supporting, the first and second means for coupling located at opposite ends of the third means for supporting; wherein the second means for coupling to cause an electrical coupling of a bottom integrated circuit (IC) module to a means for electrical grounding included in a printed circuit board (PCB), wherein the first means for coupling, the first means for supporting, and the second means for supporting to cause positioning of a top IC module above the bottom IC module and electrical coupling of the top IC module to the means for electrical grounding.

Example 36 may include the subject matter of Example 35, and may further include wherein the first means for supporting is adjacent to a first side of the first means for coupling, the second means for supporting is adjacent to a second side of the first means for coupling that is substantially opposite to the first side, and the third means for supporting is adjacent to a third side of the first means for coupling and is substantially perpendicular to the first and second means for supporting.

Example 37 may include the subject matter of any of Examples 35-36, and may further include wherein the first and second means for coupling and the first, second, and third means for supporting comprise a unitary structure.

Example 38 may include the subject matter of any of Examples 35-37, and may further include wherein the unitary structure comprises a metallic or conductive material.

Example 39 may include the subject matter of any of Examples 35-38, and may further include wherein the first and second means for supporting to support alignment of the first means for coupling to the top IC module, and the third means for supporting to support alignment of the second means for coupling to the means for electrical grounding.

Example 40 may include the subject matter of any of Examples 35-39, and may further include wherein the third means for supporting to provide a separation distance between the first and second means for coupling that is approximately the same as a distance between an edge of the top IC module closest to the apparatus and the means for electrical grounding.

Example 41 may include the subject matter of any of Examples 35-40, and may further include a fourth means for supporting located below and circumferential to the second means for coupling, the fourth means for supporting having a height to cause positioning of the top IC module above the bottom IC module.

Example 42 may include the subject matter of any of Examples 35-41, and may further include wherein one or more of the first means for coupling, the first means for supporting, the second means for supporting, and the fourth means for supporting to cause a spacing between the top and bottom IC modules.

Example 43 may include the subject matter of any of Examples 35-42, and may further include wherein the top IC module and the PCB are substantially parallel to each other.

Example 44 may include the subject matter of any of Examples 35-43, and may further include wherein the bottom and top IC modules include M.2 standard modules, and the first and second means for coupling include holes to receive M.2 standard mounting screws.

Example 45 may include the subject matter of any of Examples 35-44, and may further include wherein the means for electrical grounding comprises a single standoff.

Example 46 may include the subject matter of any of Examples 35-45, and may further include wherein the top or bottom IC module comprises a single or double sided IC module.

Example 47 may include the subject matter of any of Examples 35-46, and may further include wherein the top and bottom IC modules are the same or different sizes relative to each other.

Example 48 may include the subject matter of any of Examples 35-47, and may further include wherein the apparatus to provide an electrical grounding pathway between the top IC module and the PCB and between the bottom IC module and the PCB using the same means for electrical grounding, and wherein the apparatus to attach the top and bottom IC modules to the PCB using space on the PCB that is less than areas of both of the top and bottom IC modules.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

We claim:

1. An apparatus comprising:
    a first mounting hole;
    first, second, and third projections radiating from the first mounting hole; and
    a second mounting hole adjacent to the third projection, the first and second mounting holes located at opposite ends of the third projection;
    wherein the second mounting hole is to cause an electrical coupling of a bottom integrated circuit (IC) module to a connection structure included in a printed circuit board (PCB),
    wherein the first mounting hole, the first projection, and the second projection are to cause positioning of a top IC module above the bottom IC module and electrical coupling of the top IC module to the connection structure.

2. The apparatus of claim 1, wherein the first projection is adjacent to a first side of the first mounting hole, the second projection is adjacent to a second side of the first mounting hole that is substantially opposite to the first side, and the third projection is adjacent to a third side of the first mounting hole and is substantially perpendicular to the first and second projections.

3. The apparatus of claim 1, wherein the first and second mounting holes and the first, second, and third projections comprise a unitary structure, the unitary structure comprising a module stacking mechanism with integrated ground.

4. The apparatus of claim 1, further comprising a fourth projection located below and circumferential to the second mounting hole, the fourth projection having a height to cause positioning of the top IC module above the bottom IC module.

5. The apparatus of claim 4, wherein one or more of the first mounting hole, the first projection, the second projection, and the fourth projection to cause a spacing between the top and bottom IC modules.

6. The apparatus of claim 1, wherein the top IC module and the PCB are substantially parallel to each other.

7. The apparatus of claim 1, wherein a length of the third projection is approximately equal to a distance from the connection structure to an edge of the top IC module closest to the first mounting hole.

8. The apparatus of claim 7, wherein the length of the third projection is approximately equal to a distance between pins located at edges of the top and bottom IC modules that are opposite to the edge of the top IC module closest to the connection structure.

9. A method comprising:
    coupling first ends of a bottom integrated circuit (IC) module and a top IC module to a bottom module connector and a top module connector, respectively, wherein the bottom and top module connectors are electrically coupled to a printed circuit board (PCB), and wherein the top IC module is stacked above the bottom IC module;
    coupling a second end, that is opposite to the first end, of the top IC module to a first mounting hole of a unitary module stacking mechanism;
    coupling a second end, that is opposite to the first end, of the bottom IC module to a second mounting hole of the unitary module stacking mechanism; and
    coupling the unitary module stacking mechanism to a single hole included in the PCB.

10. The method of claim 9, wherein coupling the second end of the top IC module to the first mounting hole comprises securing and electrically coupling the top IC module to the unitary module stacking mechanism.

11. The method of claim 10, wherein electrically coupling the top IC module to the unitary module stacking mechanism comprises establishing an electrical ground path between the top IC module and the PCB.

12. The method of claim 11, wherein coupling the unitary module stacking mechanism to the single hole included in the PCB comprises securing and establishing an electrical ground path for the top and bottom IC modules to the PCB.

13. The method of claim 9, wherein coupling the second end of the bottom IC module to the second mounting hole comprises attaching a fastener in the second mounting hole, wherein one or both of a portion of the unitary module stacking mechanism adjacent to the second mounting hole or the fastener electrically couples to a grounding contact area included in the second end of the bottom IC module.

14. A computer device comprising:
a printed circuit board (PCB) including an electrical grounding structure;
a top integrated circuit (IC) module;
a bottom IC module stacked below the top IC module;
a module stacking mechanism coupled to the top and bottom IC modules and to the electrical grounding structure; and
a first mounting apparatus coupled to the module stacking mechanism, the electrical grounding structure, and the bottom IC module,
wherein the first mounting apparatus comprises a fastener that inserts into the module stacking mechanism and the electrical grounding structure, and an electrical grounding path exists between the top IC module and the PCB and between the bottom IC module and the PCB.

15. The computer device of claim 14, further comprising a second mounting apparatus coupled to the module stacking mechanism and the top IC module.

16. The computer device of claim 14, wherein the module stacking mechanism comprises metallic or conductive material.

17. The computer device of claim 14, wherein the top and bottom IC modules comprise solid state drive (SSD) modules.

18. The computer device of claim 17, wherein a memory capacity associated with the top IC module is the same or different than a memory capacity associated with the bottom IC module.

19. The computer device of claim 14, wherein the top and bottom IC modules are a same size relative to each other.

20. The computer device of claim 14, wherein the top and bottom IC modules are different sizes relative to each other.

21. The computer device of claim 14, wherein the module stacking mechanism maintains a gap distance between the top and bottom IC modules.

22. The computer device of claim 14, wherein the module stacking mechanism includes a pair of projections in contact with an edge of the top IC module, the pair of projections to stabilize positioning of the top IC module relative to the bottom IC module, to prevent rotation of the top IC module relative to the module stacking mechanism, or to automatically align a mounting hole included in the module stacking mechanism with the electrical grounding structure.

23. An apparatus comprising:
a first means for coupling;
first, second, and third means for supporting radiating from the first means for coupling; and
a second means for coupling adjacent to the third means for supporting, the first and second means for coupling located at opposite ends of the third means for supporting;
wherein the second means for coupling is to cause an electrical coupling of a bottom integrated circuit (IC) module to a means for electrical grounding included in a printed circuit board (PCB),
wherein the first means for coupling, the first means for supporting, and the second means for supporting are to cause positioning of a top IC module above the bottom IC module and electrical coupling of the top IC module to the means for electrical grounding.

24. The apparatus of claim 23, wherein the first means for supporting is adjacent to a first side of the first means for coupling, the second means for supporting is adjacent to a second side of the first means for coupling that is substantially opposite to the first side, and the third means for supporting is adjacent to a third side of the first means for coupling and is substantially perpendicular to the first and second means for supporting.

25. The apparatus of claim 23, wherein the first and second means for supporting are to support alignment of the first means for coupling to the top IC module, and the third means for supporting is to support alignment of the second means for coupling to the means for electrical grounding.

26. The apparatus of claim 23, wherein the apparatus is to provide an electrical grounding pathway between the top IC module and the PCB and between the bottom IC module and the PCB using the same means for electrical grounding, and wherein the apparatus is to attach the top and bottom IC modules to the PCB using space on the PCB that is less than areas of both of the top and bottom IC modules.

27. The computer device of claim 14, wherein
the PCB further includes a top module connector, and a bottom module connector, with the electrical grounding structure located at a first portion of the PCB and the top and bottom module connectors located at a second portion of the PCB;
the top IC module is electrically coupled to the top module connector; and
the bottom IC module is stacked below the top IC module and electrically coupled to the bottom module connector.

* * * * *

UNITED STATES PATENT AND TRADEMARK OFFICE
CERTIFICATE OF CORRECTION

PATENT NO. : 9,899,358 B2  
APPLICATION NO. : 15/163197  
DATED : February 20, 2018  
INVENTOR(S) : Alan W. Tate et al.

Page 1 of 1

It is certified that error appears in the above-identified patent and that said Letters Patent is hereby corrected as shown below:

In the Claims

Column 16
Line 31, Claim 5 delete "…projection to cause…" and insert -- …projection are to cause… --

Signed and Sealed this
Twelfth Day of June, 2018

Andrei Iancu
*Director of the United States Patent and Trademark Office*